United States Patent [19]
Orso et al.

[11] Patent Number: 6,160,410
[45] Date of Patent: Dec. 12, 2000

[54] APPARATUS, METHOD AND KIT FOR ADJUSTING INTEGRATED CIRCUIT LEAD DEFLECTION UPON A TEST SOCKET CONDUCTOR

[75] Inventors: William R. Orso, Milpitas; Khushrav S. Chhor, Fremont, both of Calif.

[73] Assignee: Cypress Semiconductor Corporation, San Jose, Calif.

[21] Appl. No.: 09/046,757

[22] Filed: Mar. 24, 1998

[51] Int. Cl.$^7$ ..................................................... G01R 1/04
[52] U.S. Cl. ........................ 324/757; 324/537; 324/158.1
[58] Field of Search .................................. 324/537, 754, 324/757, 158.1

[56] References Cited

U.S. PATENT DOCUMENTS

| | | | |
|---|---|---|---|
| 5,055,777 | 10/1991 | Bonelli et al. | 324/754 |
| 5,416,429 | 5/1995 | McQuade et al. | 324/754 |
| 5,469,074 | 11/1995 | Drabenstadt et al. | 324/758 |
| 5,493,237 | 2/1996 | Volz et al. | 324/754 |
| 5,654,631 | 8/1997 | Ames | 324/158.1 |

*Primary Examiner*—Glenn W. Brown
*Attorney, Agent, or Firm*—Kevin L. Daffer; Conley, Rose & Tayon

[57] ABSTRACT

An apparatus, method and kit is provided for aligning small, closely spaced leads of an integrated circuit to small, closely spaced test conductors within a test apparatus. The leads can be arranged in various ways, and can extend from dissimilar types of integrated circuit packages. Likewise, the test conductors can be configured from a test socket possibly within a test head. The integrated circuit or DUT is forwarded toward the test conductors by a handler. The kit is used to secure the DUT and align the leads with the test conductors. Alignment can be achieved in either two or three dimensions. According to one embodiment, the kit includes a test socket unique to the DUT having at least one pin, and preferably two pins, extending from the test socket through an insert, also provided with the kit. The insert retains the DUT and the opening within the insert extends over the pin to effectuate two-dimensional alignment. A spacer may also be provided with the kit as an alternative embodiment. The spacer can be affixed to the test socket outside the test conductors. The spacer operates similar to a shim and is designed to abut between the test socket and the insert. A change in the thickness of the spacer will modify the extent by which the leads travel toward and deflect upon respective test conductors. As such, spacer thickness will provide alignment in a third dimension so that optimal electrical contact is achieved between leads and test conductors.

24 Claims, 5 Drawing Sheets

APPARATUS, METHOD AND KIT FOR ADJUSTING INTEGRATED CIRCUIT LEAD DEFLECTION UPON A TEST SOCKET CONDUCTOR

RELATED APPLICATION

This application is related to a co-pending U.S. Patent Application to Orso and Chhor entitled "Apparatus, Method and Kit for Aligning an Integrated Circuit to a Test Socket" which is incorporated as if fully set forth herein.

BACKGROUND OF THE INVENTION

1. Field of the Invention

This invention relates to automated handling of an integrated circuit during test of that integrated circuit and, more particularly, to an apparatus, kit and method used to adjust and/or maintain optimal deflection of an integrated circuit lead when contacting a test socket conductor.

2. Description of the Related Art

The sequence of steps used in forming an integrated circuit often culminates in an assembly or packaging operation. Assembly involves hermetically sealing the integrated circuit or die inside a carrier, or within an encapsulant injected about the die. A result of the assembly operation is to protect the integrated circuit against contaminants arising from the environment into which it is placed. Only leads extend from the packaged product into the environment. The leads are electrically connected to bond pads generally arranged around the periphery of the integrated circuit. Depending on the size or complexity of the integrated circuit, the leads can take on numerous configurations and/or arrangements, and therefore the packaged product can be classified as a dual-in-line package (DIP), a quad flat package (QFP), a ball-grid array (BGA), a single-level integrated module (SLIM), for example.

Before the packaged product can be used on, for example, a printed circuit board (PCB), it is necessary that the circuit be tested after the assembly operation and before its use in the field. For example, placing the integrated circuit inside the carrier or injecting encapsulant about the circuit may damage or skew the operating parameters of the integrated circuit. As such, mechanisms have been employed to rapidly test packaged integrated circuit prior to shipping those circuits to a customer.

A common test mechanism involves placing a test head against the integrated circuit leads. The test head contains high speed circuits which generate test signals and measure the result of those signals upon the integrated circuit. Thus, a test head may employ multiple signal generators as well as multiple voltage and/or current meters. The test head may also include a test socket. The test socket is one that is unique to the integrated circuit being tested, often referred to as the "device under test" or DUT. A plurality of test conductors extend from the test socket in registry with leads extending from the packaged product or DUT. Depending on the arrangement of those leads, the test socket can be configured in numerous ways with associated test conductors arranged unique to those leads.

A handler is used to place the DUT such that its leads extend against the test socket conductors. Most modern day handlers use a pick-and-place technique, whereby DUTs are drawn in succession from an input position to a holding device. The holding device is then moved toward the test socket with the DUT securely fixed within the holding device. After contact between the leads and the test conductors have been accomplished, and the test signal stimuli sent and results recorded, the holding device and DUT are then drawn away from the test socket. Based on the outcome of the test relative to the integrated circuit specification, the pick-and-place mechanism within the handler thereafter places the DUT in the appropriate bin position.

A primary function of the handler is to repeat movement of the holding device and DUT in rapid succession from one position to another. This entails repeatably placing leads of the DUT in accurate alignment with test conductors emanating from a test socket. At best, this is difficult to achieve. For example, many modem QFPs may have a hundred or more leads extending from a periphery less than three centimeters per side. Moreover, the pitch distance between leads may be less than 50 mils. Any misalignment between those leads and the test conductors may cause improper electrical contact or, in the worst case scenario, bending of the leads or test conductors. Even in instances where the DUT is leadless, or utilizes solder balls rather than leads, misalignment of those leadless receptors and the test conductors might prevent contact between the receptors and test conductors and/or damage the elongated test conductors which extend from the test socket. Misalignment may cause the test results to indicate an open circuit or failure when, in fact, the DUT is not a failure. The stimulus applied by a misaligned test conductor may contact a neighboring lead and damage circuits connected to that lead.

Conventional mechanisms for aligning leads to test conductors primarily focus upon the test head and the handler. That is, many alignment mechanisms rely on the distance between the test socket and a test head coupler upon the test head remaining fixed over time. There is generally another coupler upon the handler arranged a pre-defined distance from the point at which the DUT is delivered from the handler toward the test head. That distance is supposed to be the same distance as that which separate the test socket and the test head coupler. In this manner, the coupler upon the test head and the coupler upon the handler connect with one another and, hopefully, the test socket will align with the DUT. However, after inserting multiple DUTs in succession against the test socket, the delivery mechanism used by the handler will begin to wear. The extent of that wear will degrade or skew the delivery point from its initial delivery position. This may result in misalignment of the DUT leads relative to the test conductors. It would therefore be beneficial to derive an alignment mechanism which can maintain the alignment after repeated use, and can also expeditiously establish alignment of the first DUT to the test socket at the moment after which the test head and handler is retrofitted with a test kit. Thus, the desired alignment mechanism would prove advantageous if it can be obtained as a kit, comprising the test socket and the DUT holding mechanism. That kit would be particularly useful if it contains a mechanism not only to ensure transverse alignment of the leads to the test conductors, but also maintains a proper depth by which a respective lead is thrust upon a corresponding test conductor. Maintaining alignment in three dimension for dissimilar lead arrangements of numerously different packaged products would serve to minimize damage to the DUT, damage to the test socket, and waste of what would otherwise be electrically acceptable DUTs.

SUMMARY OF THE INVENTION

The problems outlined above are in large part solved by an improved apparatus, kit and method for delivering a DUT in alignment with a test socket. The delivery apparatus includes any apparatus which is called upon to repeatedly apply closely spaced items against corresponding closely spaced items, preferably for use in testing those items. Thus, the intended application extends beyond the testing of integrated circuits and is applicable to testing a generic device (i.e., DUT). The delivery apparatus may utilize an existing handler suitably used in the testing of an integrated circuit. A retrofit is performed on the device which retains the DUT in position against the test socket. The retaining device (henceforth referred to as an "insert") includes at least one opening or alignment hole. According to a preferred embodiment, the alignment hole extends over a pin arranged on an outer surface of the test socket. According to a more preferred embodiment, the insert includes at least two alignment holes spaced from each other. At least two pins extend from the test socket and through the alignment holes whenever the insert, and DUT fixed within the insert, is received against the test socket.

A spacer may be used in addition to the alignment pins extending from the test socket. While a spacer is not necessary in all instances, it can be used in conjunction with the alignment pin to provide additional alignment in a third dimension. The spacer may be secured against the test socket in a region spaced laterally away from, or outside of, the test conductors. The spacer is preferably a rigid material such as metal. According to one suitable form, the spacer may be a contiguous sheet secured to a contiguous planar surface of the test socket. The contiguous spacer is designed to receive a planar surface of the insert in an area outside of the DUT. Thus, the spacer serves as a "shim" to establish the extent by which the DUT (and particularly the leads) moves in the direction of the test socket, based on the thickness of the spacer. According to an alternative form, the spacer may comprise an extendable pin, or possibly a screw, protruding from an isolated region of the spacer against the insert outside the area of the DUT whenever the insert is drawn against the test socket or, in this case, against the spacer. According to yet a further form, the spacer may comprise a cap securely fixed to the end of an adjustable-length or fixed-length pin. In the latter instance, the cap can be of variable thickness to account for a fixed-length pin. In each example, the spacer is designed to "space" the insert away from the test socket. By modifying the thickness of the spacer, regardless of the form in which it takes, the spacer can adjust the amount by which leads of the DUT extend against respective test conductors.

While the spacer ensures optimal movement of the insert and therefore the DUT leads, the alignment pins and alignment holes ensure alignment within a plane approximately perpendicular to the direction at which the DUT extends towards the test socket. The alignment holes may be slightly tapered near the surface of the insert. This allows the alignment pins to be channeled into the alignment hole and therefore to self-align leads to test conductors each time the DUT-embodied insert is directed against the test socket.

The insert and test socket can be acquired as a kit specific to a particular integrated circuit. The insert can be machined based on the outline of the DUT, with alignment holes in registry with pins machined upon a test socket having test conductors unique to the DUT lead configuration. Additionally, the kit may include a chuck which extends against a surface of the insert opposite the surface containing the DUT. A benefit in purchasing the kit is that the present alignment mechanism can be used with any integrated circuit lead configuration by simply choosing a kit specific to the integrated circuit being tested. Moreover, the kit can be used with any handler which includes an arm that draws a DUT against a test socket. Of importance is that the alignment mechanism (pins, holes, and/or spacer) is arranged as close to the DUT as possible. Thus, instead of relying upon the test socket to maintain alignment with the test head coupler and the delivery point maintaining alignment with the handler coupler (or docking plate) the present alignment mechanism operates close to or directly upon the holding mechanisms (test socket and insert) at which precision electrical mating of test conductors to leads is needed. Conventional techniques of aligning the docking plate on the handler to a chassis of the test head simply proves unworkable as an exclusive alignment technique since wear on the delivery mechanism compromises the delivery point of the pick-and-place handler.

The spacer can be machined to any desired thickness depending upon the amount of the deflection and/or contact needed between the leads and the test conductors. By changing that thickness, electrical connection between the leads and test conductors can be optimized. Electrical connectivity can be repeatedly assured using a single spacer upon the test socket rather than on possibly multiple inserts drawn to the single test socket. Using a single spacer or shim to account for variances in the insert-to-socket spacing proves beneficial not only in costs but also by virtue of its reliable repeatability among multiple inserts and DUTs.

Broadly speaking, the present invention concerns an apparatus for aligning an integrated circuit to a test socket. The apparatus may include a test system, and the test system may include a test head and a handler which delivers a DUT to the test head. Alternatively, the apparatus includes a test socket and an insert. The test socket includes at least one pin extending therefrom. That pin is placed within an opening within the insert whenever the insert is brought near the test socket. When the pin is channeled into the opening, the insert is moved along a plane perpendicular to an axial dimension directly separating the insert and the test socket. Channeling the pin into the opening therefore moves the insert in a transverse direction such that leads of a DUT fixed within the insert move accordingly. The pin-and-opening arrangement is used to self-align leads upon the DUT with test conductors upon the test socket each time the pin is mated within the opening.

The delivery mechanism may include a kit, according to one embodiment. The kit is used to align a lead of an integrated circuit to a test conductor of a test socket. The kit includes a test socket and an insert. A test socket surface of the test socket includes a pin and a test conductor spaced a first distance apart. The test conductor is one of numerous test conductors extending from the test socket. The insert includes an insert surface configured to receive the integrated circuit having multiple leads. The insert surface also includes an opening spaced from a particular lead by a second spaced distance. Preferably, the first spaced distance is equal to the second spaced distance such that the opening receives the pin concurrent with the test conductor contacting the lead of interest. There is preferably another pin, and another test conductor extending a known distance from each other. That distance is commensurate with the spacing between an opening receivable by the pin and another lead. The kit can be purchased with or separate from the test system. If purchased separate, the kit can be unique to a particular DUT and can repeatedly self-align any unique arrangement of leads on the DUT to test conductors on the test socket by merely placing pins on the singular test socket successively into openings in a plurality of inserts dimensioned to receive respective DUTs.

A method may also be used to align a lead of an integrated circuit to a test conductor of a test socket. The method includes placing the integrated circuit into an insert and moving the insert toward the test socket. The insert may thereafter continue moving while it is being laterally shifted relative to and along a plane parallel to the test socket when bringing the lead in alignment with the respective test conductor.

According to another embodiment, a spacer may be included with the apparatus and/or kit. The spacer is used to adjust compression of the lead against the test conductor. Thus, the kit and/or apparatus includes a spacer of adjustable thickness interposed between the test socket and the insert which retains the integrated circuit leads. The spacer can take on numerous configurations, including a contiguous, planar element, a pin which can adjustably extend from the test socket, or a variable thickness cap placed over a pin of fixed length, or possibly other configurations as well.

A method can be used to adjust compression of a lead against the test conductor. By continuing to move the insert, a surface of the insert outside the integrated circuit will abut against the spacer concurrent with the lead compressing against the test conductor. All of the various forms and embodiments which include an alignment pin upon a test socket, an alignment opening upon an insert, and a spacer therebetween, provide three-dimensional alignment of a relatively small component to another relatively small component each time those components are brought in close proximity to each other. The components can, according to one embodiment, be applicable to integrated circuits or generally to the mating of any relatively small, fine-pitch components which frictionally and electrically engage with one another.

BRIEF DESCRIPTION OF THE DRAWINGS

Other objects and advantages of the invention will become apparent upon reading the following detailed description and upon reference to the accompanying drawings in which.

Figure 1:
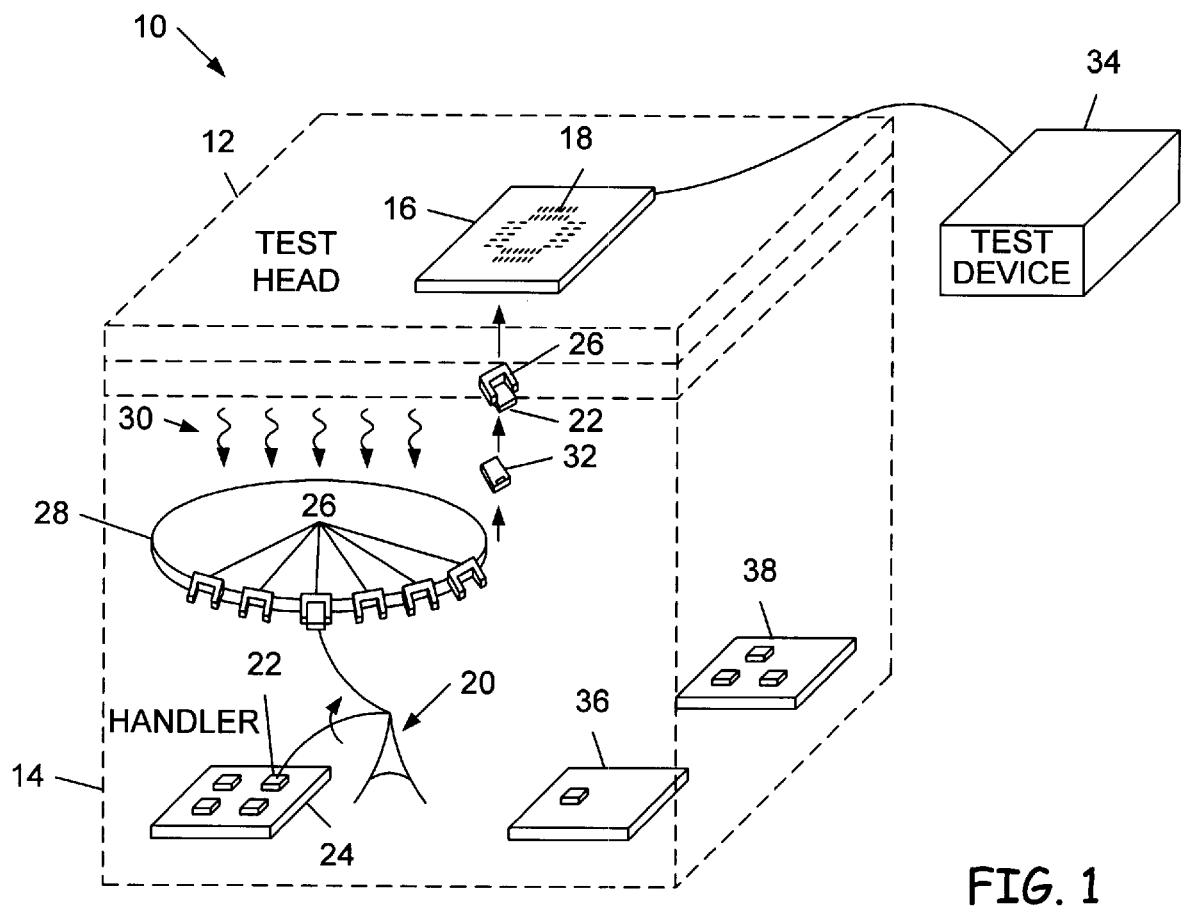
FIG. 1 is a perspective, plan view of a handler coupled to a test head, wherein the handler includes a mechanism for moving an insert containing an integrated circuit and placing leads of the integrated circuit against a test socket within the test head.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a test system 10. Test system 10 includes a test head 12 and a pick-and-place handler 14. Test head 12 may contain circuitry which generates test signals and measurement tools which quantify responses created by those signals upon a DUT. Accordingly, test head 12 includes a test socket 16 having a plurality of test conductors 18 arranged on a bottom surface of test socket 16. Test conductors 18 represent the distal ends of conductors which deliver test signals to the DUT and gather responses from the DUT. Test conductors 18 are arranged upon one surface of test socket 16. According to the embodiment shown, test conductors extend downward toward handler 14.

Handler 14 includes any mechanism which, through automation, presents DUTs in rapid succession to the test conductors 18 of test head 16. According to one embodiment, handler 14 involves a robotic arm 20 which receives a DUT 22, possibly contained within a tray 24. Arm 20 may then serve to place the DUT at an input position of a respective insert 26. As shown, numerous inserts 26 can be placed about a carousel 28 which is arranged in a heated or cooled chamber 30.

The heated (or cooled) DUT 22 can then be drawn upward within its respective insert 26 by a chuck 32. The DUT 22 retained within insert 26 is then secured against the underside of test socket 16 and, more particularly, leads of DUT 22 are secured against respective conductors 18 of test socket 16. Once circuitry within test head 12, or distal circuitry within test device 34, forwards and receives test signals and responses, the test operation has concluded and the DUT-embodied insert is drawn away from test socket 16 by lowering chuck 32. A robotic arm can then be used to place the tested DUT within a particular tray 36 or 38 depending on the results of that test. For example, tray 36 may contain DUTs which fail the parametric and functional tests performed by test head 12 and/or test device 34.

Figure 2:
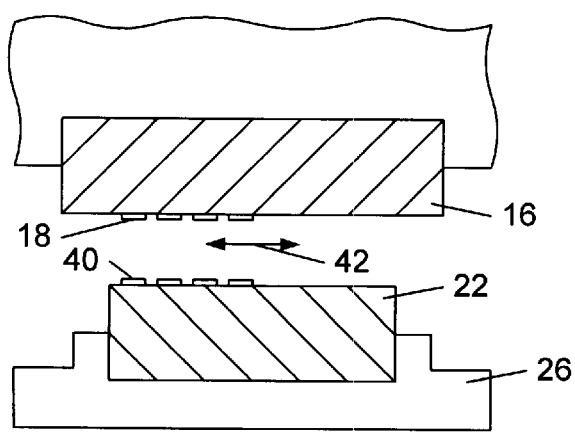
FIG. 2 is a cross-sectional view of the integrated circuit leads mis-aligned relative to test conductors emanating from the test socket.

FIG. 2 illustrates a problem which might occur absent the transverse alignment features (pins and openings) described herein below. Specifically, FIG. 2 depicts an insert 26 which may be configured to contain a DUT 22. Leads are arranged either about the periphery of the DUT or as an array across one surface of the DUT. Leads 40 are shown slightly skewed 42 from test conductors 18 of test socket 16. The skew is shown as translateral or transverse, or any other term used to indicate that leads 40 are misaligned from conductors 18 relative to a plane parallel to the plane formed by the ends of leads 40 and the ends of conductors 18. In other words, misalignment is along the plane perpendicular to an axis which directly separates the test socket and the delivery mechanism. Thus, as the delivery mechanism forwards the DUT, misalignment is shown perpendicular to that forward movement.

Figure 3:
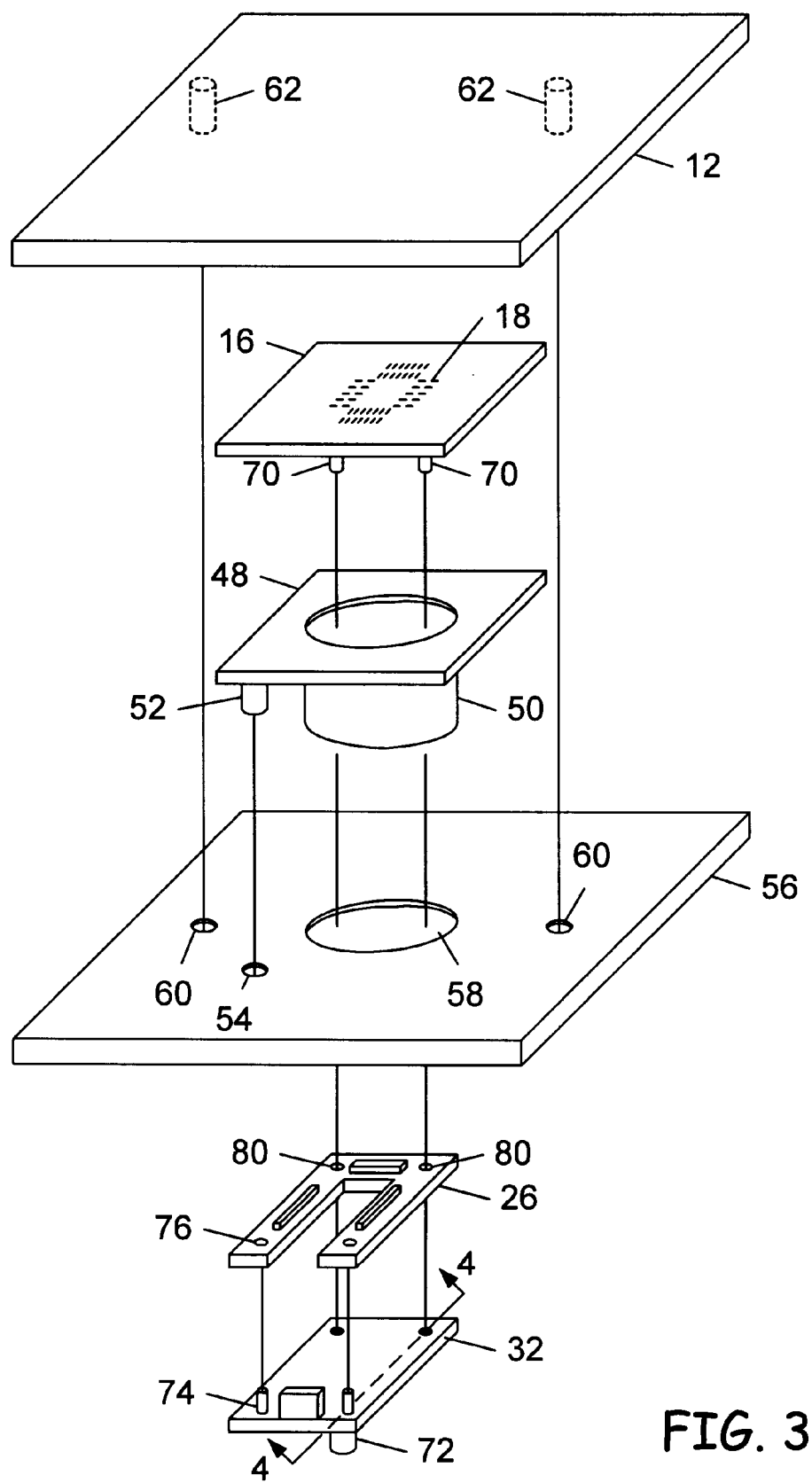
FIG. 3 is an exploded view of a chuck which extends the insert through an opening within the handler in transverse alignment with the test socket by placing openings within the insert and chuck about pins extending from the test socket.

FIG. 3 is an exploded view of various components used to align an insert and therefore the DUT to test conductors upon the test socket. Specifically, a test head 12 is shown having an underside surface which can accommodate a test socket 16. The test socket can be secured to the underside surface by various means such as, for example, screws, latches, etc. According to another embodiment, test socket 16 is secured to the underside surface by a retainer 48. Retainer 48 may include screws extending from the upper surface of retainer 48 and into the underside surface of test head 12. The lower surface of retainer 48 includes a conical opening 50 and an insert pin 52. By applying tension to the screws (not shown) retainer 48 secures test socket 16 to test head 12 using, for example, frictional engagement according to one suitable mounting technique.

Retainer 48 may be aligned in various ways. For example, insert pin 52 extending from retainer 48 may be first placed within opening 54 of docking plate 56. Once placed in position, and test conductors 18 and test socket 16 are properly aligned, test socket 16 and retainer 48 are drawn from docking plate 56 and secured in the aligned position against the underside surface of test head 12. As such, the test head 12 serves to retain test socket 16 and retainer 48 in a secured and presumably aligned position.

Docking plate 56 is deemed any rigid material which is secured to the upper surface of handler 14 (shown FIG. 1). Docking plate 56 includes an opening 58 through which the conical opening 50 extends whenever test head 12 is secured or "docked" onto handler 14 and, more particularly, docking plate 56. Also associated with docking plate 56 is a pair of openings 60 which serve to secure pins 62 extending from the underside surface of test head 12. The arrangement of pins 62 and openings 60 form a coupling mechanism whenever the test head is placed on top of the handler. The pins and openings serve to secure the test head to the handler in the docked position. Of course, there may be numerous other coupling mechanisms used to secure the test head to the handler.

Aligning the test socket 16 to test head 12, and securing test head 12 to docking plate 56 of handler 14 does not ensure optimal alignment of the DUT leads to test conductors 18. In addition to the docking arrangement, a more precise alignment of the exact objects being aligned is needed. Thus, one of the present advantages is at least one pin 70, and preferably at least two pins 70, are configured on the underside surface of test socket 16. As will be described below, pins 70 are channeled into openings 80 whenever insert 26 is drawn against test socket 16. It is known that test socket 16 comprises primarily a printed circuit board having numerous circuits arranged thereon. Extending from the printed circuit board are distal ends of test conductors 18 which face downward in the example shown. Test conductors 18 therefore extend from a planar underside surface of test socket 16 in a region laterally spaced from pin 70. In other words, pin 70 extends from test socket 16 outside of the regions occupied by test conductors 18. Moreover, pins 70 extend downward through at least an upper portion of the conical opening 50 whenever the test head is docked to the handler. FIG. 3 illustrates in more detail chuck 32 and a vertically moveable arm 72 arranged on the underside surface of chuck 32. Arm 72 serves to drive upward chuck 32 through docking plate 56 and partially through conical opening 50. Chuck 32 includes a set of pins 74 which mate with openings 76 in insert 26. Pins 74 secure insert 26 against lateral or perpendicular movement relative to the direction at which arm 72 drives insert 26 against the underside surface of test socket 16 and through openings 50 and 58. Accordingly, the robotic pick-and-place handler (shown in FIG. 1) serves to repeatably move a DUT-embodied insert 26 through opening 58 at the upper surface of handler 14, and also through the retainer 48 such that leads of the DUT extend upward in frictional engagement with test conductors 18.

Figure 4:
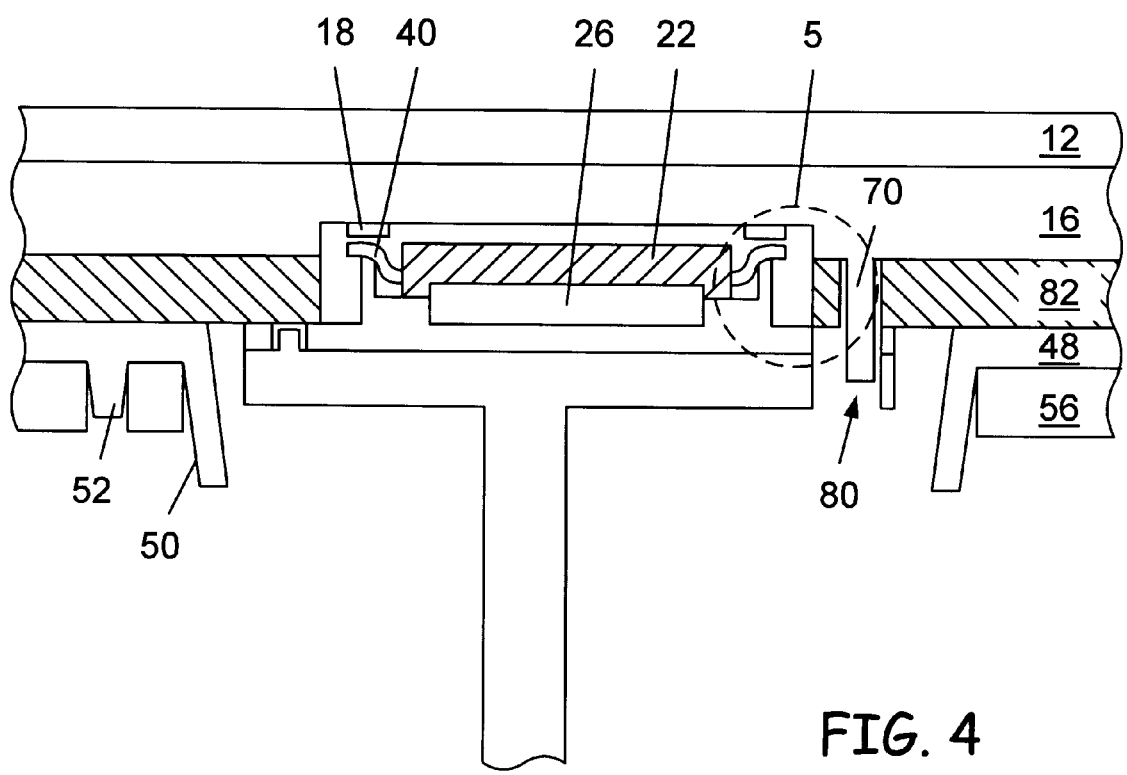
FIG. 4 is a cross-sectional view along plane 4 of FIG. 3, illustrating the chuck, insert and integrated circuit fully extended against the test socket which, according to one embodiment, includes a spacer of variable thickness extending from the test socket toward the insert.

FIG. 4 illustrates a cross-sectional view along plane 4—4 of FIG. 3. Specifically, FIG. 4 depicts a DUT 22 embodied within insert 26 and driven to its optimal height proximate to the underside surface of test socket 16. According to one embodiment, DUT 22 can be configured as a QFP with leads 40 extending about the periphery of DUT 22. Leads 40 are shown aligned with test conductors 18 along a plane parallel to the underside surface of test socket or the upper, inverted surface of DUT 22. In a peripheral-lead arrangement, a portion of insert 26 extends upward against an underside of leads 40 to provide support when the leads extend against the test conductors. Alignment of leads 40 to test conductors 18 is achieved by the mating of pins 70 within openings 80.

Figure 5A:
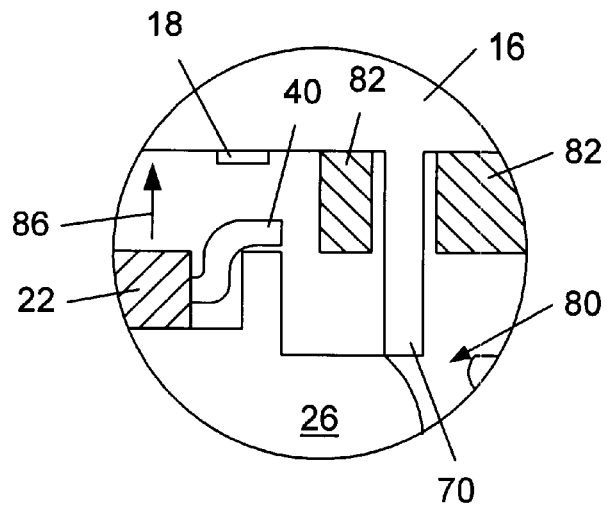
FIGS. 5a, 5b and 5c are cross-sectional views along plane 5 of FIG. 4, illustrating various forms usable as the spacer and also illustrating the alignment pin of the test socket extending into a tapered opening within the insert for laterally moving the insert, and integrated circuit fixed within the insert, to a position whereby the integrated circuit leads are aligned with conductors of the test socket and the leads deflect upon the test conductors an amount adjusted by the spacer thickness.
Figure 5B:
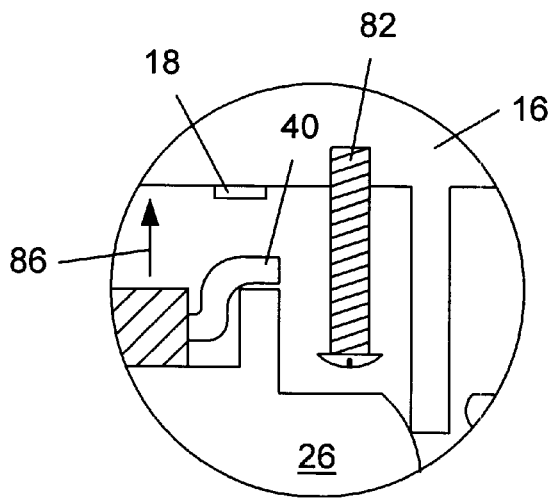
Figure 5C:
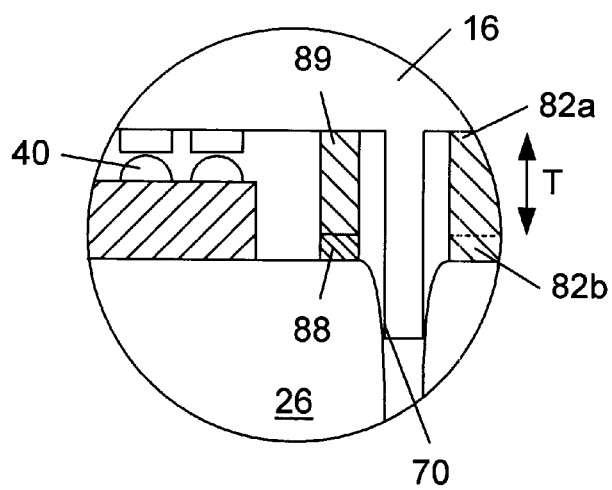

According to the example shown, pins 70 and openings 80 provide horizontal alignment. In addition to horizontal alignment, a spacer 82 may be used to provide vertical alignment. Of course, it is understood that the arrangement indicates vertical thrusts of arm 72 and chuck 32; however, it may also be assumed that chuck 32 can be driven in the horizontal direction, whereby pins 70 and openings 80 take on a vertical (rather than a horizontal) alignment function. Regardless of the arrangement of the delivery mechanism, the combination of pins 70, openings 80 and spacer 82 provide three-dimensional alignment of leads 40 to test conductors 18. FIGS. 5a–5c illustrate numerous configurations of leads upon a DUT, and a spacer which provides vertical stop of leads against test conductors.

FIG. 5a illustrates a detailed view along area 5 of FIG. 4, except that FIG. 5a indicates a slight space between insert 26 (or leads 40) and the corresponding surfaces of spacer 82 (or test conductor 18). Arrow 86 indicates the upward movement of insert 26 and retained DUT 22. Spacer 82 provides an upward stop, and the tapered edges of opening 80 serve to shift insert 26 and retained DUT 22 in a horizontal direction as the insert is being moved upward.

FIG. 5b illustrates upward movement 86 beyond that shown in FIG. 5a. Specifically, pin 70 is being channeled by the sidewall taper of opening 80 so that insert 26 is drawn in a horizontal direction as it is pushed upward. Further shown in FIG. 5b is an alternative form of spacer 82. Specifically, spacer 82 may include merely an adjustable length pin (or screw). Instead of attaching a contiguous layer of rigid material across the underside surface of test socket 16, FIG. 5b illustrates a spacer 82 extending from the underneath surface of test socket 16 only within an isolated region of that underneath surface. More particularly, pin 82 is extendable from a small, isolated region of the underside surface of test socket 16. This allows use of a spacer when the underneath surface is substantially congested with, for example, circuit elements or non-planar surfaces.

FIG. 5c illustrates further upward movement of insert 26 to a stopping position. Alternatively, another spacer form is shown, whereby either a pin 89 of fixed elongated dimension extends from the underside surface of test socket 16, or a contiguous layer of rigid material 82a is secured and therefore extends from the underneath surface. The contiguous form can comprise two layers 82a and 82b to form a spacer of variable thickness. Alternatively, the pin 89 can include a cap 88 placed over an end of pin 89. Layer 82b or cap 88 can be of variable thickness to account for differences in the distance by which insert 26 extends upward. Alternatively, layer 82a and pin 86 can be of variable thickness T to account for differences in the extent of vertical delivery. FIG. 5c further illustrates an alternative lead arrangement, possibly used in a BGA package having an array of solderballs extending from one planar surface of DUT 22 rather than leads extending from the perimeter of DUT 22. Regardless of the lead arrangement and the depth of each lead, spacer 82, or adjustable pins with or without caps can be used to account for that variance in depth.

Figure 6:
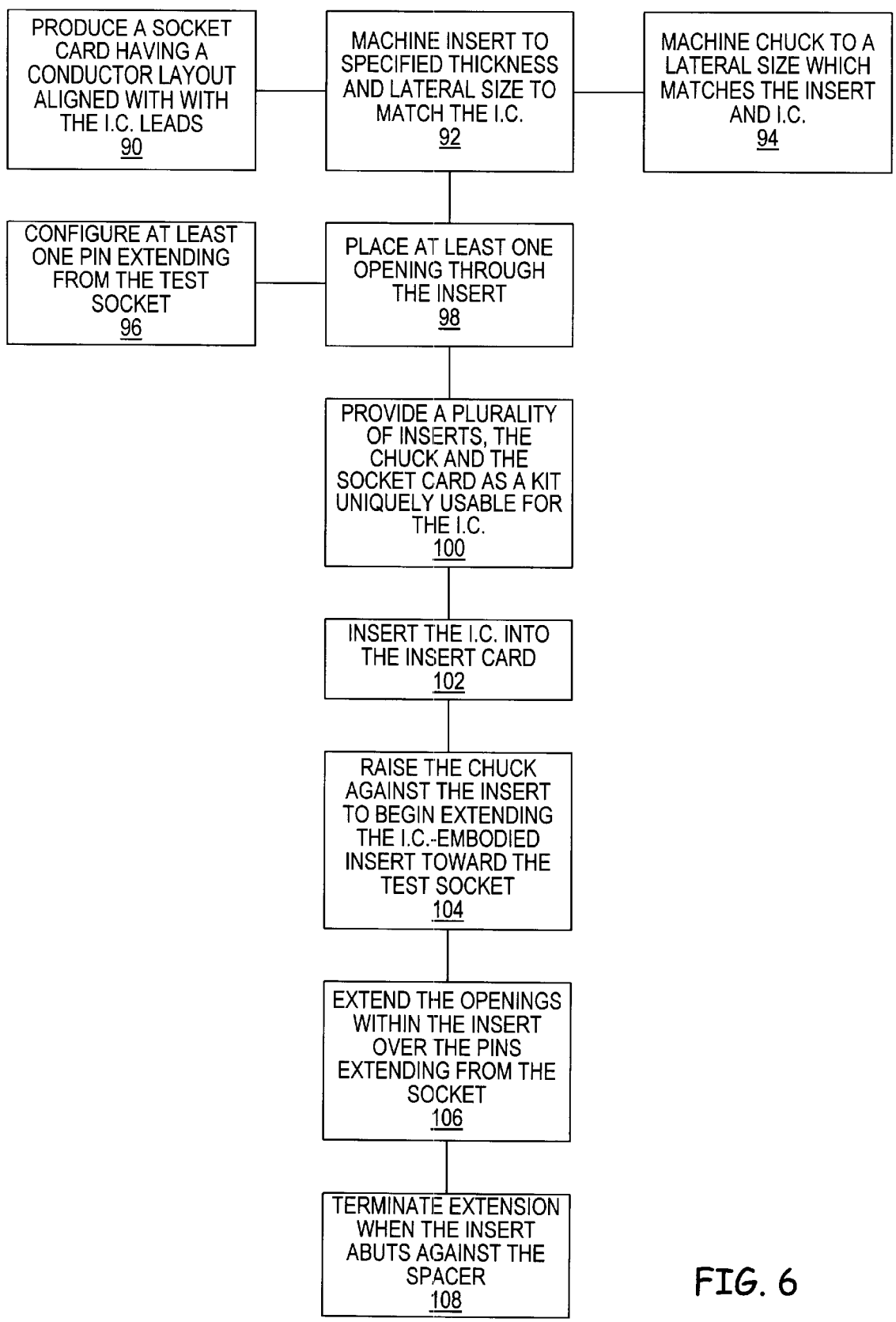
FIG. 6 is a flow diagram of a method used to align the integrated circuit leads with the test socket conductors.

FIG. 6 illustrates a sequence of steps used to self-align leads to test conductors each time a DUT is delivered toward the test socket. That alignment occurs in three dimensions using the combination of pins, sockets and spacers proximate to the insert which retains the DUT leads and the test socket which retains the test conductors.

Initially, a socket card must be produced having the plurality of test conductors 90. An insert can then be produced 92 to a specified thickness. The lateral size and configuration of the insert is chosen to match the outer footprint or perimeter of the integrated circuit. The configuration of the insert is chosen so that it securely retains approximately three sides of the integrated circuit perimeter. A chuck which raises and lowers the insert is also machined 94 having a lateral size and geometry which matches an insert surface opposite the DUT. As described above, the socket card is produced with preferably two pins extending downward in registry with an opening formed within the insert. The insert also contains another pair of openings which receive pins extending from the chuck. Thus, steps 96 and 98 illustrate the pin and opening arrangement within the test socket and insert, respectively.

There may be numerous inserts which can be placed within a carousel and concurrently heated or cooled. Each insert can retain a corresponding DUT or integrated circuit. Accordingly, a kit can be provided comprising a plurality of inserts, the socket card and the chuck unique for the DUT 100. Once the kit is selected for a particular pin arrangement and/or package size, the DUT is placed within an insert 102. The chuck is then raised against the insert to begin extending the DUT toward the test socket 104. As the insert approaches the test socket, openings within the insert extend over pins protruding from the test socket. The amount by which the insert is driven toward the test socket terminates when the insert abuts against the spacer 108. Of course, the spacer thickness can vary depending on the amount of compression desired between the DUT leads and corresponding test conductors.

It will be appreciated to those skilled in the art having the benefit of this disclosure that this invention is believed applicable to any device which mates relatively small, fine-pitch elements. According to one embodiment, those elements entail test conductors of an automated test device and leads of an integrated circuit. It is understood that the form of the invention show is to be taken as exemplary, presently preferred embodiments. Regardless of how the DUT is presented, or the orientation of the DUT to the test head, the present invention is suited for ensuring the leads and test conductors are properly aligned with each other in two dimensions or in three dimensions. The combination of hardware elements placed proximate to the DUT and test socket as well as the orientation of the pick-and-place handler to the test head ensures alignment is rapidly and repeatedly achieved. Accordingly, the specification and drawings are to be regarded in an illustrative rather than a restrictive sense as to possibly numerous variations which fall within the spirit and scope of the present invention.

What is claimed is:

1. An apparatus, comprising a spacer of adjustable thickness interposed between and in contact with a test socket surface of a test socket from which a test conductor extends and an insert which retains an integrated circuit.

2. The apparatus as recited in claim 1, wherein the test socket comprises a plurality of test conductors electrically coupled to a test head.

3. The apparatus as recited in claim 2, wherein the thickness of said spacer is chosen to adjust compression of said integrated circuit lead against a respective one of said plurality of test conductors.

4. The apparatus as recited in claim 2, wherein the plurality of test conductors are configured to receive test signals derived from a test device electrically coupled to the test head.

5. The apparatus as recited in claim 1, wherein the spacer comprises opposed planar surfaces which abut between planar surfaces of the test socket and the insert.

6. The apparatus as recited in claim 1, wherein the spacer comprises a cap placeable over the distal end of a pin extending from the test socket.

7. The apparatus as recited in claim 1, wherein the spacer comprises a pin, the pin being of extendable length emanating from the test socket.

8. The apparatus as recited in claim 1, wherein the thickness of said spacer is adjusted such that the integrated circuit lead produces minimal contact with the test socket during times when the test socket and insert bear against the spacer.

9. The apparatus as recited in claim 1, wherein the insert retains the integrated circuit such that lateral movement of the integrated circuit relative to the insert is restricted.

10. The apparatus as recited in claim 1, wherein the spacer is interposed between and in contact with the test socket surface of the test socket and a surface of the insert in a region outside an area occupied by the test conductor and a lead of the integrated circuit.

11. A kit, comprising:
   a test socket surface of a test socket from which a test conductor extends;
   an insert surface of an insert configured to receive an integrated circuit with a lead of the integrated circuit oriented toward the test conductor; and
   a spacer interposed between and in contact with the test socket surface and the insert surface in a region outside an area occupied by the test conductor and the lead, wherein the spacer comprises a thickness which allows the lead to achieve minimal electrical contact with the test conductor during times when the spacer is fully engaged between the test socket surface and the insert surface.

12. The kit as recited in claim 11, wherein said minimal electrical contact comprises a minimal amount of deflection of the test conductor and the lead to maintain electrical conduction therebetween.

13. The kit as recited in claim 11, wherein the spacer comprises a pin extending from the test socket surface, and wherein the thickness of the spacer comprises an amount by which the pin extends from the test socket surface.

14. The kit as recited in claim 11, wherein the amount by which the pin extends from the test socket surface is adjustable.

15. The kit as recited in claim 11, wherein the spacer comprises a cap configured upon a pin extending from the test socket surface, and wherein the thickness of the spacer comprises a thickness of the cap measured along an axis perpendicular to the test socket surface.

16. The kit as recited in claim 11, wherein the insert retains the integrated circuit such that lateral movement of the integrated circuit relative to the insert is restricted.

17. A method, comprising:

placing an integrated circuit into an insert;

moving the insert toward a test socket surface of a test socket onto which a spacer is secured, wherein a test conductor extends from the test socket surface; and continuing said moving the insert such that a surface of the insert outside the integrated circuit abuts against the spacer concurrent with a lead of the integrated circuit compressing against the test conductor.

18. The kit as recited in claim 17, wherein an amount by which the lead compresses against the test conductor along the axis is proportional to the thickness of said spacer.

19. The kit as recited in claim 11, wherein the lead is brought against the test conductor along an axis which extends directly between the lead and the test conductor.

20. The method as recited in claim 19, wherein said compressing the lead against the test conductor comprises deflecting the lead and the test conductor an amount sufficient to form electrical conduction therebetween.

21. The method as recited in claim 20, wherein said deflecting comprises frictionally engaging the lead and the test conductor.

22. The method as recited in claim 20, wherein said deflecting is less than an amount which would permanently bend the test conductor.

23. The method as recited in claim 20, wherein said deflecting is less than an amount which would permanently bend the lead.

24. The method as recited in claim 19, wherein the insert retains the integrated circuit such that lateral movement of the integrated circuit relative to the insert is restricted.

* * * * *

UNITED STATES PATENT AND TRADEMARK OFFICE
CERTIFICATE OF CORRECTION

PATENT NO. : 6,160,410
DATED : December 12, 2000
INVENTOR(S) : Orso et al.

Page 1 of 1

It is certified that error appears in the above-identified patent and that said Letters Patent is hereby corrected as shown below:

<u>Claim 18, column 11,</u>
Line 10, after the phrase "as recited in claim" please delete the number "17" and substitute therefor -- 11 --.

<u>Claim 20, column 11,</u>
Line 16, after the phrase "as recited in claim" please delete the number "19" and substitute therefor -- 17 --.

Signed and Sealed this

Thirtieth Day of October, 2001

*Attest:*

Nicholas P. Godici

NICHOLAS P. GODICI
*Acting Director of the United States Patent and Trademark Office*

*Attesting Officer*